United States Patent [19]

Kim

[11] Patent Number: 5,204,216
[45] Date of Patent: Apr. 20, 1993

[54] RADIATION-SENSITIVE MIXTURE

[75] Inventor: Son N. Kim, Hemsbach, Fed. Rep. of Germany

[73] Assignee: BASF Aktiengesellschaft, Ludwigshafen, Fed. Rep. of Germany

[21] Appl. No.: 648,533

[22] Filed: Jan. 30, 1991

[30] Foreign Application Priority Data

Feb. 20, 1990 [DE] Fed. Rep. of Germany ....... 4005212

[51] Int. Cl.$^5$ .............................................. G03C 1/76
[52] U.S. Cl. .................... 430/270; 430/325; 522/75
[58] Field of Search ................... 430/270, 325; 522/75

[56]  References Cited

U.S. PATENT DOCUMENTS

| | | | |
|---|---|---|---|
| 3,915,706 | 10/1975 | Limburg et al. | 96/27.2 |
| 4,491,628 | 1/1985 | Ito et al. | 430/176 |
| 4,678,737 | 7/1987 | Schneller et al. | 430/210 |
| 4,689,288 | 8/1987 | Buiguez et al. | 430/270 |
| 4,770,977 | 9/1988 | Buiguez et al. | 430/323 |
| 4,916,046 | 4/1990 | Dossel | 430/270 |
| 5,035,979 | 7/1991 | Nguyen-Kim et al. | 430/270 |
| 5,084,371 | 1/1992 | Schwim et al. | 430/270 |
| 5,093,221 | 3/1992 | Chen et al. | 430/270 |

FOREIGN PATENT DOCUMENTS 0031566 8/1981 European Pat. Off. .

OTHER PUBLICATIONS

Application of Photoinitiated Cationic Polymerization Toward the Development of New Photoresists, Crivello, Org. Coatings and Appl. Polym. Sci 48 (1985), 65-69.

J. Polymer Sci. Part A, Polymer Chemistry Ed., vol. 24, (1986); 2971-1980 ITO.

Primary Examiner—Jack P. Brammer
Attorney, Agent, or Firm—Keil & Weinkauf

[57]  ABSTRACT

A radiation-sensitive mixture, essentially consisting of
(a) a binder or binder mixture which is insoluble in water but soluble in aqueous alkaline solutions,
(b) a compound which forms a strong acid on exposure to radiation and
(c) one or more organic compounds which suppress the solubility of (a) in aqueous alkaline solutions, wherein component (c) is an organic compound of the general formula (I)

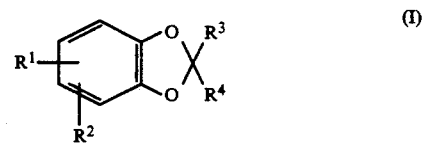

where $R^1$ and $R^2$ are each hydrogen, alkyl, alkoxy, aryl or aralkyl and $R^3$ and $R^4$ are each alkyl, cycloalkyl, aralkyl, aryl or a radical

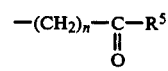

where n is from 1 to 5 and $R^5$ is alkyl, alkoxy, aryl or aralkyl, or $R^3$ together with $R^4$ form a five-membered to seven-membered ring via —$(CH_2)_m$— in which m is from 4 to 6, is suitable for the production of relief structures.

10 Claims, No Drawings

RADIATION-SENSITIVE MIXTURE

The present invention relates to positive-working radiation-sensitive mixtures which contain a binder which is insoluble in water but soluble in aqueous alkaline solutions, a compound which forms an acid when exposed to radiation and an organic compound which undergoes acid-catalyzed hydrolysis, with the result that the alkali solubility of the mixture is increased. These mixtures are sensitive to UV radiation, electron beams and X-rays and are particularly suitable as resist material.

Positive-working radiation-sensitive mixtures are known, and in particular positive-working resist materials which contain o-quinonediazides in binders which are soluble in aqueous alkaline solutions, for example novolaks or poly-p-vinylphenols, are used commercially. However, the sensitivity of some of these systems to radiation, in particular short-wavelength radiation, is unsatisfactory.

Increases in the sensitivity of radiationsensitive systems which, in the primary photochemical reaction, produce a species which then initiates a catalytic secondary reaction independently of the radiation have been described. Thus, U.S. Pat. No. 3,915,706 describes, for example, photoinitiators which produce a strong acid which then cleaves acid-labile groups, such as polyaldehyde groups, in a secondary reaction.

Other known radiation-sensitive mixtures are those based on acid-cleavable compounds which contain, as a binder, a polymer which is soluble in aqueous alkaline solutions, and a compound which forms a strong acid in a photochemical reaction and a further compound which has acid-cleavable bonds and whose solubility in an alkaline developer increases due to the action of the acid (cf. DE-A 3 406 927). Compounds which form a strong acid in a photochemical reaction are diazonium, phosphonium, sulfonium, iodonium and halogen compounds. The use of these onium salts as photochemical acid donors in resist material is is also disclosed in, for example, U.S. Pat. No. 4,491,628. An overview of the use of onium salts in resist materials is given by Crivello in Org. Coatings and Appl. Polym. Sci. 48 (1985), 65–69.

Radiation-sensitive mixtures of polymers having acid-labile side groups and photochemical acid donors are disclosed in, for example, U.S. Pat. No. 4,491,628 and FR-A 2,570,844. However, these polymeric binders are hydrophobic and become alkali-soluble only after exposure.

Copolymers having phenolic and acid-labile groups, for example poly-(p-hydroxystryene-co-tertbutoxycarbonyloxystyrene), are disclosed in J. Polym. Sci., Part A, Polym. Chem. Ed. 24 (1986), 2971–1980. However, if those copolymers of this group which are still alkali-soluble are used in conjunction with the commercial sulfonium salts, such as triphenylsulfonium hexafluoroarsenate, as also described in U.S. Pat. No. 4,491,628, these mixtures have the disadvantage that a very large amount of material is removed from the unexposed parts, since the stated sulfonium salts do not sufficiently contribute toward suppressing solubility. Furthermore, after exposure, these salts do not help to increase the solubility of the exposed parts in alkaline developers, since no alkali-soluble photochemical products are formed.

DE-A 37 21 741 describes radiation-sensitive mixtures which contain a polymeric binder which is soluble in aqueous alkaline solutions, and an organic compound whose solubility in an aqueous alkaline developer is increased by the action of an acid and which contains one or more acid-cleavable groups, this organic compound producing a strong acid on exposure to radiation.

It is an object of the present invention to provide novel highly active positive-working radiation-sensitive systems for the production of relief structures, which systems can be developed with aqueous alkaline solutions and permit the production of layers sensitive to short-wavelength UV light.

We have found that this object is achieved if a radiation-sensitive mixture which contains a binder which is insoluble in water but soluble in aqueous alkaline solution, an acid-labile organic compound which is hydrolyzed by the action of an acid and a compound which forms a strong acid on exposure to radiation is exposed imagewise and heated and the imagewise exposed parts of the layer are washed out with a developer.

We have found, surprisingly, that highly active radiation-sensitive systems for the production of relief structures in short-wavelength UV light are obtained by the use of certain pyrocatechol derivatives as compounds which suppress the solubility of the binders in aqueous alkaline solutions, said systems having very good reproducibility and high resolution, especially in combination with novolak-based binders.

The present invention relates to a radiationsensitive mixture, essentially consisting of
(a) a binder or binder mixture which is insoluble in water but soluble in aqueous alkaline solutions,
(b) a compound which forms a strong acid on exposure to radiation and
(c) one or more organic compounds which suppress the solubility of (a) in aqueous alkaline solutions,
wherein the organic compound (c) is a compound of the general formula (I)

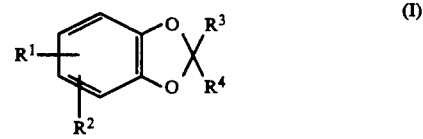

where $R^1$ and $R^2$ are identical or different and are each hydrogen, alkyl, alkoxy, aryl or aralkyl, $R^3$ and $R^4$ are identical or different and are each alkyl, cycloalkyl, aralkyl, unsubstituted or alkyl- or halogen-substituted aryl or a radical

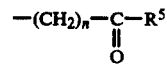

where n is from 1 to 5 and $R_5$ is alkyl, alkoxy, aryl or aralkyl, or $R^3$ together with R forms a five-membered to seven-membered ring via $-(CH_2)_m-$ in which m is from 4 to 6.

The novel radiation-sensitive mixture may contain, as binder (a), a phenolic resin, for example a novolak having a mean molecular weight $\overline{M}_w$ of from 300 to 20,000 or poly-(p-hydroxystyrene), poly-(p-hydroxy-α-methylstyrene) or copolymers of p-hydroxystyrene and p-tert-butoxycarbonyloxystyrene, of p-hydroxystyrene and alkoxystyrene or of p-hydroxystyrene and 2-tetrahydropyranyloxystyrene (where these copolymers can also be prepared by a polymer-analogous reaction), having mean molecular weights $\overline{M}_w$ from 200 to 200,000 in each case.

The binder component (a) is present in general in an amount of from 50 to 95% by weight, based on the total amount of components (a)+(b)+(c), with the proviso that the sum of the percentages stated under (a), (b) and (c) is 100.

Preferred compounds (b) which form an acid on exposure to radiation are onium salts of the general formula (II) or (III)

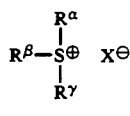

(II)

or

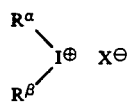

(III)

where $R^\alpha$, $R^\beta$, and $R^\gamma$ are identical or different and are each alkyl, aryl, aralkyl or a radical

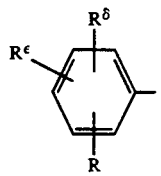

where $R^\delta$, $R^\epsilon$ and R are identical or different and are each H, OH, halogen, alkyl or alkoxy and $X^\ominus$ is $AsF_5^\ominus$, $SbF_6^\ominus$, $PF_6^\ominus$, $BF_4^\ominus$, $ClO_4^\ominus$, $CH_3SO_3^\ominus$ or $CF_3SO_3^\ominus$.

Component (b) is present in general in an amount of from 1 to 20% by weight, based on the total amount of components (a)+(b)+(c).

The novel radiation-sensitive mixture preferably contains, as the organic compound (a) which suppresses the solubility of component (c) in aqueous alkaline solutions, one or more of the compounds

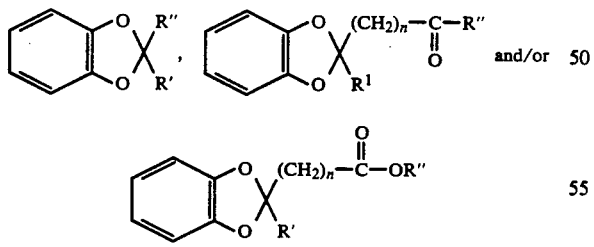

and/or where R' and R" are identical or different and are each alkyl of 1 to 6 carbon atoms, phenyl or benzyl and n is 1, component (c) being present in general in an amount of from 1 to 49% by weight based on the total amount of components (a)+(b)+(c). The sum of the percentages stated under (a), (b) and (c) is 100.

The novel radiation-sensitive mixture may additionally contain a sensitizer which absorbs radiation and transfers it to component (b), or additionally not more than 1% by weight, based on the total amount of components (a)+(b)+(c), of an adhesion promoter, a surfactant or a dye.

The present invention furthermore relates to a process for the production of relief structures or for structuring wafers by application of a photoresist solution in a layer thickness of from 0.1 to 5 μm to a substrate pretreated in a conventional manner, drying, imagewise exposure, if necessary heating to temperatures of up to 150° C and development with an aqueous alkaline solution, wherein the photoresist solution used contains the novel radiation-sensitive mixture.

The novel system is particularly advantageous since it can be used in combination with the especially economical novolak-based binders. The relief structures obtained with said system have very good reproducibility and high resolution.

Regarding the components of the novel radiationsensitive mixtures, the following may be stated specifically.

a) Because of the plasma etching stability generally required, suitable binders or binder mixtures which are insoluble in water but soluble in aqueous alkaline solutions are in general phenolic resins, for example novolaks having molecular weights $\overline{M}_w$ of from 300 to 20,000, preferably from 300 to 2,000, g/mol, and, for exposure in the short-wavelength UV range ($\leq$ 300 nm), in particular novolaks based on p-cresol/formaldehyde, poly-(p-hydroxystyrenes) and poly-(p-hydroxy-α-methylstyrenes), where these poly-(p-hydroxystyrenes) generally have molecular weights $\overline{M}_w$ of from 200 to 200,000, preferably from 1,000 to 40,000, g/mol and may furthermore be modified in a known manner by reaction (polymer-analogous reaction) of their hydroxyl groups with, for example, chloroacetic acid, a chloroacetic ester, an alkyl halide, a benzyl halide, 3,4-dihydropyran, dihydrofuran, a chlorocarbonic ester and/or a pyrocarbonic ester. The modified polymeric binders (a) which are obtainable in this manner and in the present case are also understood as being copolymers are, for example, those obtained from p-hydroxystyrene and p-tert-butoxycarbonyloxystyrene, p-hydroxystyrene and alkoxystyrene and p-hydroxystyrene and 2-tetrahydropyranylhydroxystyrene. Preferred copolymers of p-hydroxystyrene, which contain protective side groups, essentially possess the groups

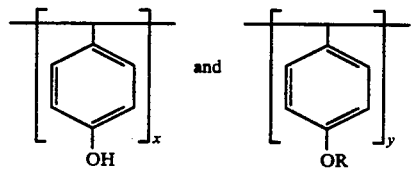

where $x \geq y$ and

R is 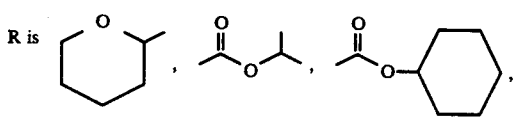

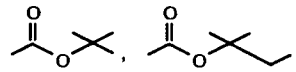

i.e. copolymers having p-(2-tetrahydropyranyl)-oxystyrene, p-(isopropyloxycarbonyl)-oxystyrene, p-(cyclohexyloxycarbonyl)-oxystyrene, p-(tert-butoxycarbonyl)-oxystyrene and/or p-(tert-pentyloxycarbonyl)-oxystyrene units.

Mixtures of the abovementioned binders (a) are also suitable. Binder (a) is present in the novel mixture in general in amounts of from 50 to 95, preferably from 70 to 85, % by weight, based on the total amount of the radiation-sensitive mixture (a)+(b)+(c).

b) Suitable compounds (b) which form a strong acid on exposure to radiation are in principle all compounds which have this property and thus act as an acid donor. However, iodonium and in particular sulfonium salts are preferred for exposure to short-wavelength UV radiation. These are of the general formulae (II) and (III)

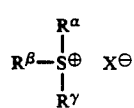

and

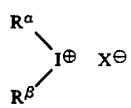

where $R^\alpha$, $R^\beta$ and $R^\gamma$ are identical or different and are each alkyl, for example of 1 to 5, preferably 1 or 2, carbon atoms, aryl, e.g. phenyl, aralkyl, e.g. benzyl, or a radical

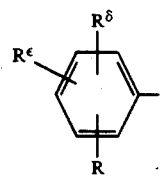

where $R^\delta$, $R^\epsilon$ and R are identical or different and are each hydrogen, OH, halogen, e.g. chlorine or bromine, alkyl, for example of 1 to 5 carbon atoms, preferably methyl or tert-butyl, or alkoxy, for example of 1 to 5 carbon atoms, preferably methoxy, and $X^\ominus$ is $AsF_6^\ominus$, $SbF_6^\ominus$, $PF_6^\ominus$, $BF_4^\ominus$, $ClO_4^\ominus$, $CH_3SO_3^\ominus$ or $CF_3SO_3^\ominus$ (=triflate).

Examples of particularly suitable components (b) are triphenylsulfonium salts and diphenyliodonium salts, tris-(4-hydroxyphenyl)-sulfonium salts, tris-(trimethylsilyloxyphenyl)-sulfonium salts, tris-(4-tert-butoxycarbonyloxyphenyl)-sulfonium salts and tris-(4-ethoxycarbonyloxyphenyl)-sulfonium salts, each having $ClO_4^\ominus$, $AsF_6^\ominus$, $PF_6^\ominus$, $SbF_6^\ominus$, $BF_4^\ominus$, $CH_3SO_3^\ominus$ or $CF_3SO_3^\ominus$ as the counter-ion $X^\ominus$.

Mixtures of the compounds stated under (b) can also be used. Component (b) is present in the novel radiation-sensitive mixture in general in amounts of from 1 to 20, preferably from 3 to 10, % by weight, based on the total amount of radiation-sensitive mixture (a)+(b) (c).

c) According to the invention, organic compounds of the general formula (I)

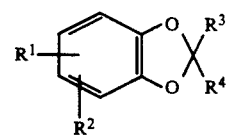

where $R^1$ and $R^2$ are identical or different and are each hydrogen, alkyl, for example of 1 to 5 carbon atoms, preferably methyl or tert-butyl, alkoxy, for example of 1 to 5 carbon atoms, preferably methoxy, aryl, e.g. phenyl, or aralkyl, e.g. benzyl, and $R^3$ and $R^4$ are identical or different and are each alkyl, for example of 1 to 5, preferably 2 to 4, carbon atoms, e.g. ethyl, n-propyl or n-butyl, aralkyl where the alkyl group is of 1 or 2 carbon atoms, such as benzyl, halogen-substituted aralkyl, e.g. p-chlorobenzyl, aryl, e.g. phenyl, alkyl-substituted aryl, such as tolyl, alkoxy-substituted aryl, such as methoxyphenyl, aryl which is substituted by halogen (such as F, Cl, Br or I, preferably Cl or Br), e.g. p-chlorophenyl, or a radical

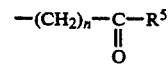

where n is from 1 to 5, preferably 1, and $R^5$ is alkyl of, for example, 1 to 5 carbon atoms, preferably one carbon atom, alkoxy of, for example, 1 to 5, preferably 1 to 4, carbon atoms, e.g. methoxy, ethoxy or tert-butoxy, aryl, e.g. phenyl, or aralkyl, for example having 1 or 2 carbon atoms in the alkyl group, such as benzyl, or $R^3$ together with $R^4$ form a five-membered to seven-membered, preferably six-membered, ring via —(CH$_2$)$_m$— in which m is from 4 to 6, preferably 5, are used as organic compounds (c) which suppress the solubility of the binder (a).

Preferred organic compounds (c) are

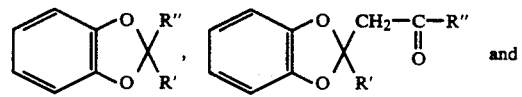

and

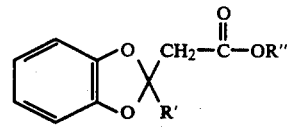

where R' and R'' are identical or different and are each alkyl of 1 to 6, preferably 2 to 4, carbon atoms, phenyl or benzyl.

Examples of preferred organic compounds (c) are:

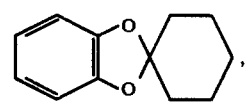

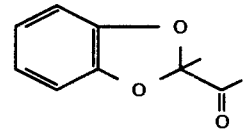

-continued

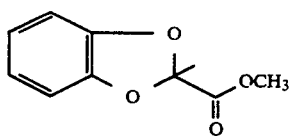

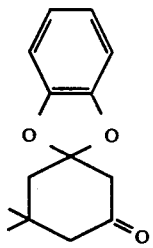

Mixtures of the abovementioned organic compounds (c) can also be used. Organic compounds (c) can be prepared by known processes, as described in, for example, Protective Groups in Organic Synthesis, page 108 et seq., for example from pyrocatechol and carbonyl compounds, e.g. cyclohexanone, in the presence of an acid.

Component (c) is present in the novel radiation-sensitive mixture in general in amounts of from 1 to 49, preferably 10 to 27, % by weight, based on the total amount of components (a)+(b)+(c).

The novel radiation-sensitive mixture may additionally contain further conventional assistants and additives.

The novel mixtures are preferably dissolved in an organic solvent, the solids content generally being from 5 to 40% by weight. Preferred solvents are aliphatic ketones, ethers and esters, and mixtures thereof. Alkylene glycol monoalkyl ethers, for example ethylcellosolve, butylglycol, methylcellosolve and 1-methoxy-2-propanol, alkylene glycol alkyl ether esters, for example methylcellosolve acetate, ethylcellosolve acetate, methylpropylene glycol acetate and ethylpropylene glycol acetate, ketones, for example cyclohexanone, cyclopentanone and methyl ethyl ketone, and acetates, such as butyl acetate, and aromatics, such as toluene and xylene, are particularly preferred. The choice of the corresponding solvents and mixtures thereof depends on the choice of the particular phenolic polymer, of the novolak and of the photosensitive component.

Other additives, such as adhesion promoters, wetting agents, dyes and plasticizers, may also be introduced, in general in amounts of not more than 1% by weight.

If required, small amounts of sensitizers may also be added in order to sensitize the compounds in the longer-wavelength UV range up to the visible range. Polycyclic aromatics, such as pyrene and perylene, are preferred for this purpose, but other dyes which act as sensitizers may also be used.

In the novel process for the production of relief images, a radiation-sensitive recording layer which essentially consists of the novel radiation-sensitive mixture is exposed imagewise to a dose such that the solubility of the exposed parts in aqueous alkaline solvents increases and these exposed parts can be selectively removed by means of the alkaline developer.

Particular advantages of the novel radiation-sensitive mixtures are very good reproducibility, high resolution and high sensitivity in the short-wavelength UV range.

The photoresist solutions containing the novel radiation-sensitive mixture are generally applied in layer thicknesses of from 0.1 to 5 μm, preferably from 0.5 to 1.5 μm, to suitable substrates, for surface-oxidized silicon wafers, by spin coating, and the layers are dried (for example at from 70° to 130° C.) and are exposed imagewise to a suitable light sources through a photomask. Particularly suitable light sources are short-wavelength UV lamps (deep UV) having wavelengths of from 200 to 300 nm and excimer lasers of KrF (248 nm). After the imagewise exposure and if necessary after a brief postbake at not more than 150° C, development is carried out using a conventional aqueous alkaline developer, in general at a pH of from 12 to 14, the exposed parts being washed out. The resolution is in the submicron range. The exposure energy required for the novel radiation-sensitive mixtures is in general from 80 to 250 mJ/cm$^2$ for a layer thickness of 1 μm.

In the Examples which follow, parts and percentages are by weight, unless stated otherwise.

EXAMPLE 1

A photoresist solution is prepared from 80 parts of a poly-(p-hydroxystyrene) having a mean molecular weight $\overline{M}_w$ of 7,000, 5 parts of tris-(4-hydroxyphenyl)-sulfonium triflate, 15 parts of the compound

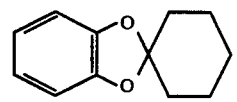

and 250 parts of ethylene glycol monomethyl ether acetate.

The solution is then filtered through a filter having a pore diameter of 0.2 μm.

The resist solution is applied by spin coating at 4000 rpm for 30 seconds to a silicon wafer which is coated with hexamethyldisilazane as an adhesion promoter, layer thickness of about 1 μm being obtained. The wafer is dried on a hotplate at 80° C. for 3 minutes, then brought into contact with an imagewise structured test mask and exposed to an excimer laser (λ=248 nm, E=35 mW/cm$^2$). Thereafter, the wafer is heated at 80° C. for 1 minute and is developed with a developer of pH 12.0–13.6. The photosensitivity is 150 mJ/cm$^2$.

EXAMPLE 2

A photoresist solution is prepared by mixing 70 parts of cresol/formaldehyde novolak ($\overline{M}_w$: about 300), 5 parts of triphenylsulfonium hexafluoroarsenate (commercial product from ALFA), 25 parts of the compound

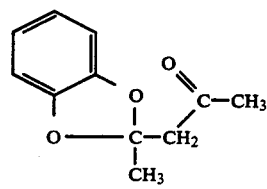

and 250 parts of ethylene glycol monomethyl ether acetate, and is further processed as described in Example 1. A photosensitivity of 190 mJ/cm$^2$ is obtained.

EXAMPLE 3

A photoresist solution comprising 70 parts of poly-(p-hydroxystyrene) ($\overline{M}_w$: 7,000), 5 parts of triphenylsulfonium hexafluoroarsenate, 25 parts of the compound

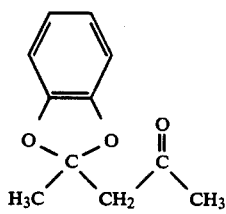

and 250 parts of ethylene glycol monomethyl ether acetate, is further processed similarly to Example 1. A photosensitivity of 80 mJ/cm$^2$ is obtained.

We claim:

1. A radiation-sensitive mixture, consisting essentially of effective amounts of
   (a) a binder or binder mixture which is insoluble in water but soluble in aqueous alkaline solutions,
   (b) a compound which forms a strong acid on exposure to radiation and
   (c) one or more organic compounds which suppress the solubility of (a) in aqueous alkaline solutions, compound (c) is a compound of the general formula (I)

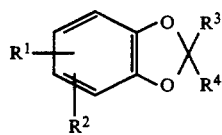 (I)

where R$^1$ and R$^2$ are identical or different and are each hydrogen, alkyl, alkoxy, aryl or aralkyl, R$^3$ and R$^4$ are identical or different and are each alkyl, cycloalkyl, aralkyl, unsubstituted or alkyl- or halogen-substituted aryl or a radical

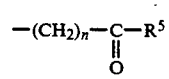

where n is from 1 to 5 and Rs is alkyl, alkoxy, aryl or aralkyl, or R$^3$ together with R$^4$ forms a five-membered to seven-membered ring via —(CH$_2$)$_m$— in which m is from 4 to 6.

2. A radiation-sensitive mixture as claimed in claim 1, wherein the binder (a) used is a phenolic resin.

3. A radiation-sensitive mixture as claimed in claim 2, wherein the phenolic resin used is a novolak having a mean molecular weight $\overline{M}_w$ of from 300 to 20,000.

4. A radiation-sensitive mixture as claimed in claim 1, wherein the binder (a) used is poly-(p-hydroxystyrene), poly-(p-hydroxy-α-methylstyrene) or a copolymer of p-hydroxystyrene and p-tert-butoxycarbonyloxystyrene, or p-hydroxystyrene and alkoxstyrene or of p-hydroxystyrene and 2-tetrahydropyranyloxystyrene (where these copolymers can also be prepared by a polymer-analogous reaction), each having a mean molecular weight $\overline{M}_w$ of from 200 to 200,000.

5. A radiation-sensitive mixture as claimed in claim 1 wherein the binder component (a) is present in an amount of from 50 to 95% by weight based on the total amount of components (a)+(b)+(c), with the proviso that the sum of the percantages stated under (a), (b) and (c) is 100.

6. A radiation-sensitive mixture as claimed in claim 1, wherein an onium salt of the formula (II) or (III)

 (II)

or

 (III)

where R$^\alpha$, R$^\beta$ and R$^\gamma$ are identical or different and are each alkyl, aryl, aralkyl or a radical

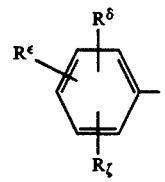

where R$^\delta$, R$^\epsilon$ and R$^\xi$ are identical or different and are each H, OH, halogen, alkyl or alkoxy and X$^\ominus$ is AsF$_6^\ominus$, SbF$_6^\ominus$, PF$_6^\ominus$, BF$^\ominus$, ClO$_4^\ominus$, CH$_3$SO$_3^\ominus$ or CF$_3$SO$_3^\ominus$, is used as the compound (b) which forms a strong acid on exposure to radiation.

7. A radiation-sensitive mixture as claimed in claim 1, wherein component (b) is prasant in an amount of from 1 to 20% by weight, based on the total amount of components (a)+(b)+(c).

8. A radiation-sensitive mixture as claimed in claim 1, wherein component (c) is prssent in an amount of from 1 to 49% by weight, based on the total amount of components (a)+(b)+(c).

9. A radiation-sensitive mixture as claimed in claim 1, which additionally contains a sensitizer which absorbs radiation and transfers it to component (b).

10. A radiation-ssnsitive mixture as claimed in claim 1, whioh additionally contains not more than 1% by weight, based on the total amount of components (a)+(b)+(c), of an adhesion promotsr, a surfactant or a dye.

* * * * *

UNITED STATES PATENT AND TRADEMARK OFFICE
CERTIFICATE OF CORRECTION

PATENT NO. : 5,204,216

DATED : April 20, 1993

INVENTOR(S) : Kim

It is certified that error appears in the above-identified patent and that said Letters Patent is hereby corrected as shown below:

Claim 1, Column 9, Line 48

That part reading "$R_s$" should read --$R^5$--

Claim 7, Column 10, Line 46

That part reading "totaI" should read --total--

Signed and Sealed this

Eleventh Day of January, 1994

Attest:

BRUCE LEHMAN

Attesting Officer     Commissioner of Patents and Trademarks